United States Patent
Kirschenmann et al.

(10) Patent No.: US 7,421,252 B2
(45) Date of Patent: Sep. 2, 2008

(54) CENTER FREQUENCY CONTROL OF AN INTEGRATED PHASE ROTATOR BAND-PASS FILTER USING VCO COARSE TRIM BITS

(75) Inventors: Mark A. Kirschenmann, Chandler, AZ (US); Derek K. Wong, Tempe, AZ (US)

(73) Assignee: Freescale Semiconductor, Inc., Austin, TX (US)

(*) Notice: Subject to any disclaimer, the term of this patent is extended or adjusted under 35 U.S.C. 154(b) by 399 days.

(21) Appl. No.: 11/195,478

(22) Filed: Aug. 2, 2005

(65) Prior Publication Data
US 2007/0032210 A1 Feb. 8, 2007

(51) Int. Cl.
*H04B 1/40* (2006.01)

(52) U.S. Cl. .................. 455/85; 455/147; 455/340; 455/280; 455/255; 375/148; 375/272

(58) Field of Classification Search .............. 455/85, 455/147, 340, 280, 255; 375/148, 272
See application file for complete search history.

(56) References Cited

U.S. PATENT DOCUMENTS

| | | | |
|---|---|---|---|
| 4,694,471 A * | 9/1987 | Blesser ................ | 375/272 |
| 5,066,923 A | 11/1991 | Gailus et al. | |
| 5,134,718 A | 7/1992 | Gailus | |
| 5,483,681 A | 1/1996 | Bergsten et al. | |
| 5,493,715 A | 2/1996 | Humphreys et al. | |
| 5,594,754 A * | 1/1997 | Dohi et al. ........... | 375/148 |
| 5,715,236 A | 2/1998 | Gilhousen et al. | |
| 5,894,496 A | 4/1999 | Jones | |
| 5,973,570 A | 10/1999 | Salvi et al. | |
| 6,353,359 B1 | 3/2002 | Leizerovich | |
| 6,381,286 B1 | 4/2002 | Wilkinson et al. | |
| 6,426,683 B1 | 7/2002 | Gu et al. | |
| 6,463,266 B1 | 10/2002 | Shohara | |
| 6,560,449 B1 | 5/2003 | Liu | |
| 6,775,530 B2 | 8/2004 | Severson et al. | |
| 6,816,716 B2 | 11/2004 | Shohara | |
| 6,934,341 B2 * | 8/2005 | Sahlman ............... | 375/297 |
| 7,120,416 B2 * | 10/2006 | Tomita ................. | 455/340 |
| 2004/0166813 A1 | 8/2004 | Mann et al. | |
| 2005/0239428 A1 * | 10/2005 | Seendripu et al. .... | 455/280 |

* cited by examiner

*Primary Examiner*—Sanh D Phu
(74) *Attorney, Agent, or Firm*—Dillon & Yudell LLP

(57) ABSTRACT

A phase rotator for a Cartesian feedback power amplifier in a transmitter final stage contains an integrated voltage controlled tunable resonant circuit accomplishing band-pass filtering at a center frequency selected by local oscillator (LO) coarse trim control signals. The voltage controlled tunable resonant circuit attenuates input signal harmonic levels at large fractional bandwidths for the downconverter in the feedback LO path without setting a large number of poles in the band-pass filter. The binary-weighted course trim value for controlling the gain of the LO sets a bank of voltage-variable capacitors (VVC) in the voltage controlled tunable resonant circuit to control the center frequency in each of two 2-pole band-pass filters, creating a composite 4-pole band-pass filter at the input of a poly-phase quadrature generation circuit in the feedback LO path.

24 Claims, 3 Drawing Sheets

CENTER FREQUENCY CONTROL OF AN INTEGRATED PHASE ROTATOR BAND-PASS FILTER USING VCO COARSE TRIM BITS

BACKGROUND OF THE INVENTION

1. Field of the Invention

The invention generally relates to radio transmitters, and in particular relates to an apparatus and method for band-pass filtering in the transmitter feedback loop.

2. Description of the Related Art

Standards relating to radio communications such as TETRA (Terrestrial Trunked RAdio), UMTS (Universal Mobile Telecommunications System) and EDGE (Enhanced Data Rates for GSM Evolution) generally require a high degree of linearity in transmitter equipment to reduce noise between closely spaced radio channels. Linearization of power amplifiers in transmitter equipment has been extensively researched and many techniques such as Cartesian loop, Polar loop, Envelope Elimination and Restoration, LINC (LInear amplification using Nonlinear Components) and CALLUM (combined analog locked loop universal modulator) have been produced.

Linearity and bandwidth are traded off in these techniques, with high linearity being possible over narrow bandwidth and moderate linearity over a broader bandwidth. Most techniques also trade linearity for efficiency. Power amplifiers used in radio transmitters are more efficient when operated at higher power but then have lower linearity, particularly near their peak power ratings. These techniques are less satisfactory for mobile communications that require both high linearity and also high efficiency for longer battery life and lower weight.

The Cartesian loop technique involves negative feedback applied to a baseband input signal having in-phase and quadrature components. The feedback signal is a measure of distortion introduced in the forward path of the loop, primarily by the amplifier, and is subtracted from the input signal in real time. This modifies the input signal with an error signal that tends to cancel the distortion at the output of the amplifier.

In order to obtain a stable feedback system, it is required that the feedback quadrature signals are approximately 180 degrees shifted relative to the incoming quadrature signals when the feedback loop is closed. Due to the unknown and variable phase shift generated by the feedback loop under antenna loading, this condition is not always fulfilled. The incoming and feedback quadrature signals are usually brought into the required relative phase with each other with the aid of a compensating phase rotation in the feedback loop. A common method to determine the phase rotation generated by the feedback loop is to open the loop and to measure the incoming in-phase and quadrature signals (I/Q), and the feedback quadrature signals. The measured values are analog-to-digital converted, and the phase error is calculated. Thereafter, a voltage-controlled phase rotator is regulated by the converted digital values to apply a phase shift in Cartesian loop systems to counter radio frequency (RF) delays around the feedback loop.

To ensure the accuracy of the phase rotation, existing Cartesian loop circuits provide noise filtering to remove the additional noise and distortion introduced by the Cartesian loop. However, Cartesian feedback loop band-pass filter designs can be complicated because quadrature generation circuits require strong filtering of input signal harmonic levels to preserve quadrature balance. Moreover, different channels usually require different phase shifts and different optimum settings, further complicating the filter designs. To achieve adequate attenuation of the input signal harmonic levels, while still supporting the large fractional bandwidths required in such systems, band-pass filters for phase rotators have traditionally increasing the number of polls and, correspondingly, the complexity and cost of the band-pass filters. What is needed is a band-pass filter integrated into the Cartesian feedback loop that filters the input signal harmonic levels at large fractional bandwidths, while remaining a low-complexity filter design.

BRIEF DESCRIPTION OF THE DRAWINGS

In the following detailed description of exemplary embodiments of the invention, reference is made to the accompanying drawings, which form a part hereof, and in which is shown by way of illustration specific exemplary embodiments in which the invention may be practiced, and in which like numbers represent the same or similar elements, as follows.

DETAILED DESCRIPTION OF PREFERRED EMBODIMENTS

Figure 1:
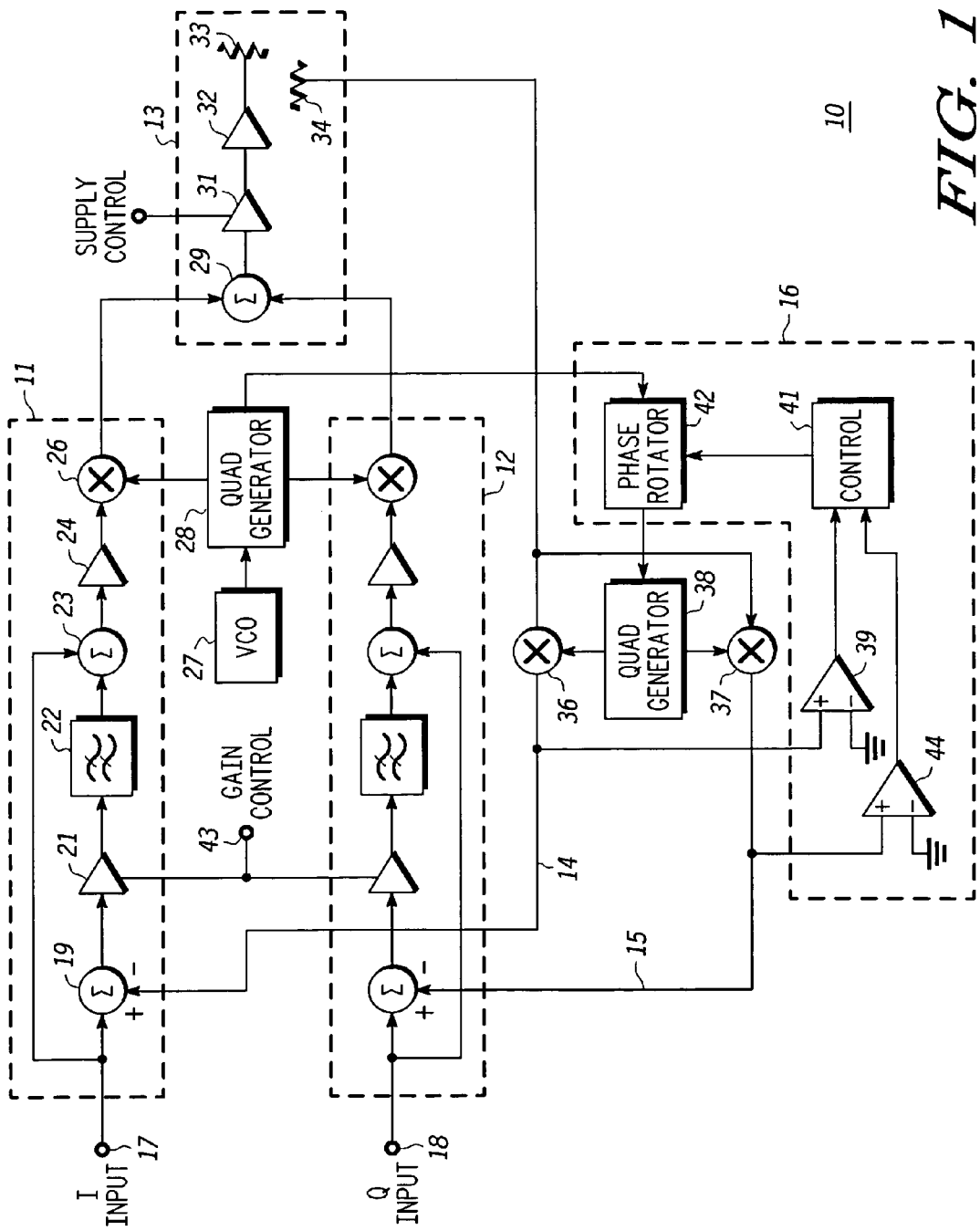
FIG. 1 generally depicts a Cartesian feedback transmitter in accordance with a preferred embodiment.

With reference now to the figures, and in particular with reference to FIG. 1, a Cartesian feedback transmitter in accordance with a preferred embodiment can be seen as generally depicted by the reference numeral 10. The transmitter 10 includes generally a first and second information signal path 11 and 12, a combined information signal path 13, first and second feedback paths 14 and 15, and a phase adjustment unit 16.

The first and second information signal paths 11 and 12 are identical to one another in this embodiment. They differ only in that the first path 11 receives an in-phase base-band information input signal 17, whereas the second path 12 receives a quadrature base-band information input signal. Therefore, only the first path 11 will be described in detail.

The first information path 11 couples its input 17 to a differential summer 19. The remaining input to this differential summer 19 couples to the first feedback path 14. The summer output couples to a variable gain base-band amplifier 21 that itself couples through a low-pass filter 22 to a summer 23. Variable gain base-band amplifier 21 provides gain control of the information path 11 by gain control signal 43. The remaining input to this summer 23 couples to the input 17 to support open loop operation. The output of the summer 23 passes through another amplification stage 24 to a mixer 26, which up-converts the incoming base-band signal to a predetermined carrier frequency of choice. The injection signal for the mixer 26 is provided by a quadrature generator 28 modulated by local oscillator (LO) 27, with the second information path 12 receiving an injection signal that has been phase shifted by 90 degrees by quadrature generator 28.

The outputs of both information paths 11 and 12 couple to the inputs of a summer 29 that represents the input to the combined information signal path 13. The output of the summer 29 couples to the input of an exciter 31 and then through a power amplifier (PA) 32 to an appropriate output element 33.

A coupler 34 responsive to the output of the PA 32 provides a feedback signal to both the first and second feedback paths 14 and 15. The up-converted signal as obtained from the PA output is first down-converted through appropriate RF feedback downconverters 36 and 37, and then provided to the subtractive inputs of the first and second information signal path differential summers 19 as mentioned above. The down-conversion injection signals for the RF feedback downconverters 36 and 37 are provided in quadrature by quadrature generator 38 under the provision of an appropriate phase shift by a phase shift unit 16.

The phase shift unit 16 provides comparators 39 and 44 to detect phase differences between the two inputs 17 and 18 and the two feedback paths 14 and 15, and to provide any differential information to a control unit 41 that in turn controls a phase rotator 42 that couples between the quadrature generator 28 and the quadrature generator 38 to provide a phase shift to the quadrature signals received from quadrature generator 28 and then applied to the inputs of quadrature generator 38, which generates the injection inputs for the radio frequency (RF) feedback downconverters 36 and 37.

Figure 2:
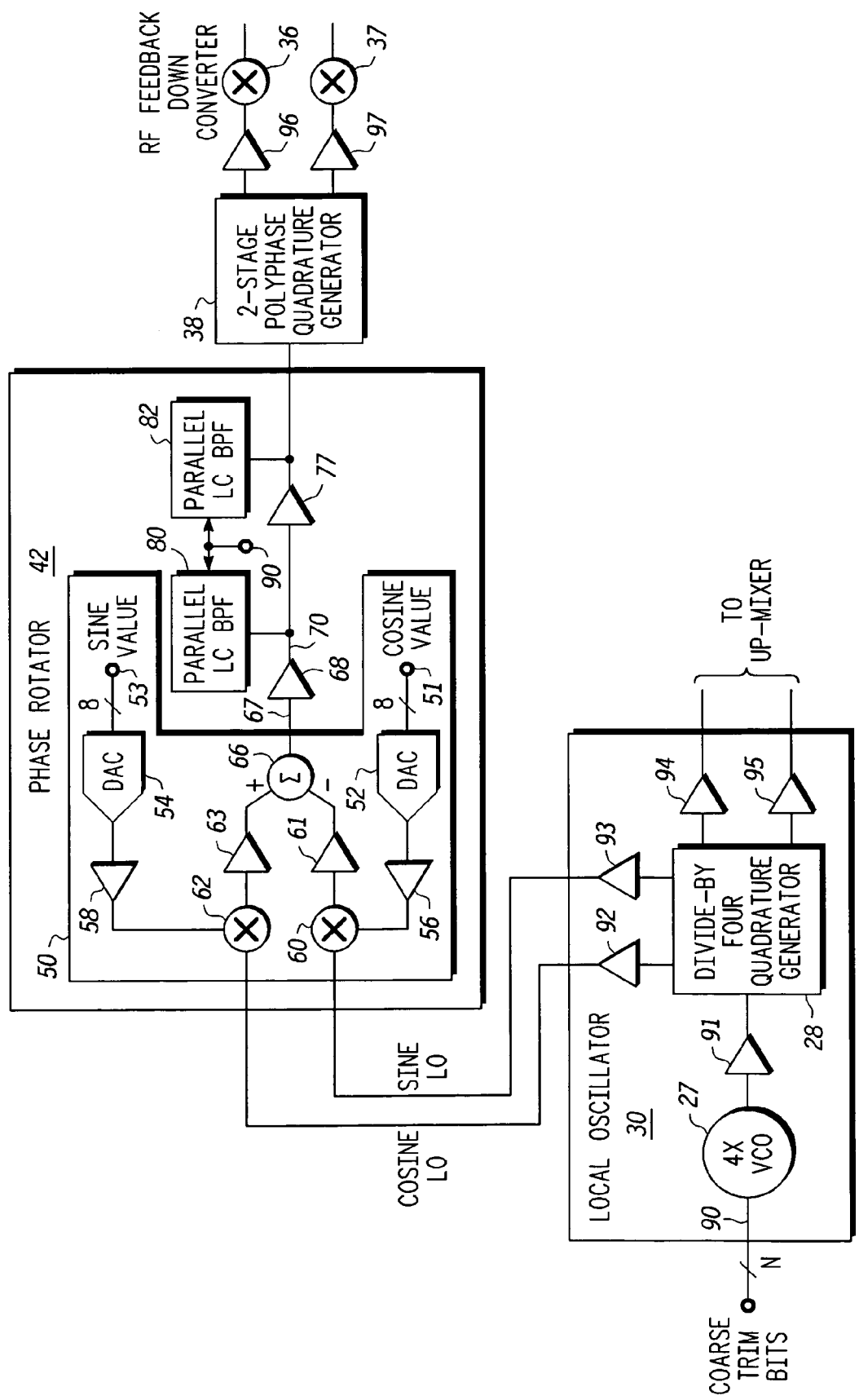
FIG. 2 shows a more detailed block diagram of selected components of the Cartesian feedback transmitter, in accordance with a preferred embodiment of the present invention.

With reference now to FIG. 2, there is shown a more detailed block diagram of phase rotator 42, quadrature generator 38, RF feedback downconverters 36 and 37, and local oscillator 30, in accordance with a preferred embodiment of the present invention. Local oscillator 30 generates the local oscillation (LO) signals used as injection signals into up-mixers 26 and phase rotator 42. An oscillation signal is generated by VCO 27 at four-times (4×) the system operating frequency set by Coarse Trim Bits at input 90 to VCO 27. The Coarse Trim Bits represent a 4-bit value specifying a desired center frequency for the output transmissions of transmitter 10 on element 33. The VCO oscillation signal is output by VCO 27, amplified by amplification stage 91, and received at quadrature generator 64, which is a divide-by-four quadrature generator to generate quadrature components (I/Q) at one-fourth (¼) the frequency of the VCO oscillation signal. As will be appreciated, local oscillator 30 can be set to any desired operating frequency by tuning VCO 27 to a corresponding frequency. As an example, VCO 27 generates a four gigahertz (4 GHz) oscillation signal that is divided down to one gigahertz (1 GHz) quadrature LO signals (I/Q) by quadrature generator 64. Quadrature generator 64 generates a cosine synthesizer signal (Cosine LO) and a sine synthesizer signal (Sine LO) that is buffered by amplifier stages 92, 93, respectively, and thereafter coupled to mixer 60, 62, respectively. Quadrature generator 64 also outputs Cosine LO and Sine LO to up-mixers 26 through amplifier stages 94 and 95.

Quadrature modulator 50 receives a cosine phase rotation value 51 and the sine phase rotation value 53 from a lookup function in control circuitry 41. Cosine value 51 and sine value 53 are coupled to digital-to-analog converters (DACs) 52 and 54, respectively, which are in turn coupled through buffers 56, 58 to mixers 60, 62, respectively. Mixers 60, 62 up-convert the incoming phase rotation values 51, 53 to a 45 degree angle to the predetermined carrier frequency of choice as a function of the injection signals Cosine LO and Sine LO provided by local oscillator 30.

The quadrature generated Cosine and Sine LO signals are mixed with the cosine and sine lookup signals 51, 53 at mixers 60, 62 and their outputs summed at summer 66 following amplification at buffers 61, 63, respectively. Summer 66 sums the input from buffer 61 as a negative value and the input from buffer 63 as a positive value to generate a differential output 67 from quadrature modulator 50. The differential output 67 from quadrature modulator 50 is coupled to a buffer 68 generating a RF differential pair output on differential connection 70, which is further amplified by buffer 77 as an output from phase rotator 42 on connection 72.

For optimal performance, phase rotator 42 requires rejection of the harmonics generated by the quadrature generator 64 prior to injection into poly-phase quadrature generator 38 at the inputs to RF feedback downconverters 36, 37. A 4-pole band-pass filter function is fully integrated into the feedback LO path by inclusion of parallel-connected LC band-pass filters 80 and 82. While BPF's 80, 82 are shown integrated into phase rotator 42 in a preferred embodiment, other embodiments have the band-pass filters integrated outside the phase rotator or as discrete components connected in parallel with the injection signals into the down-conversion mixers.

Phase rotator 42 includes a set of tunable, band-pass filters (BPFs) 80, 82 coupled in parallel with differential connections 70 and 72, respectively, to form an integrated, tunable 4-pole BPF, in accordance with a preferred embodiment of the present invention. Although two BPFs 80, 82 are shown in a preferred embodiment, the present invention is not limited to such a configuration, and may be implemented with a single BPF or any number of BPFs. In accordance with the preferred embodiment, BPFs 80, 82 are parallel LC filters tunable to a capacitive value providing an optimized 4-pole filtering function across a bandwidth centered at the feedback LO path output frequency.

Each of band-pass filters 80, 82 is a 2-pole band-pass filter that is fully tunable by Variable Voltage Control at an input 78 receiving the Coarse Trim Bits used to set the operating frequency of VCO 27. For example, if VCO 27 has its Course Trim Bits set to 1 GHz, the resulting 4 GHz VCO output signals are divided by four by quadrature generator 64 and output as Cosine LO and Sine LO centered at 1 GHz. Accordingly, band-pass filters 80 and 82 are set by Variable Voltage Control to a band-pass centered on the output frequency of quadrature modulator 50. In the above example, Variable Voltage Control input 78 would set the center frequency of BPFs 80, 82 at 1 GHz.

Figure 3:
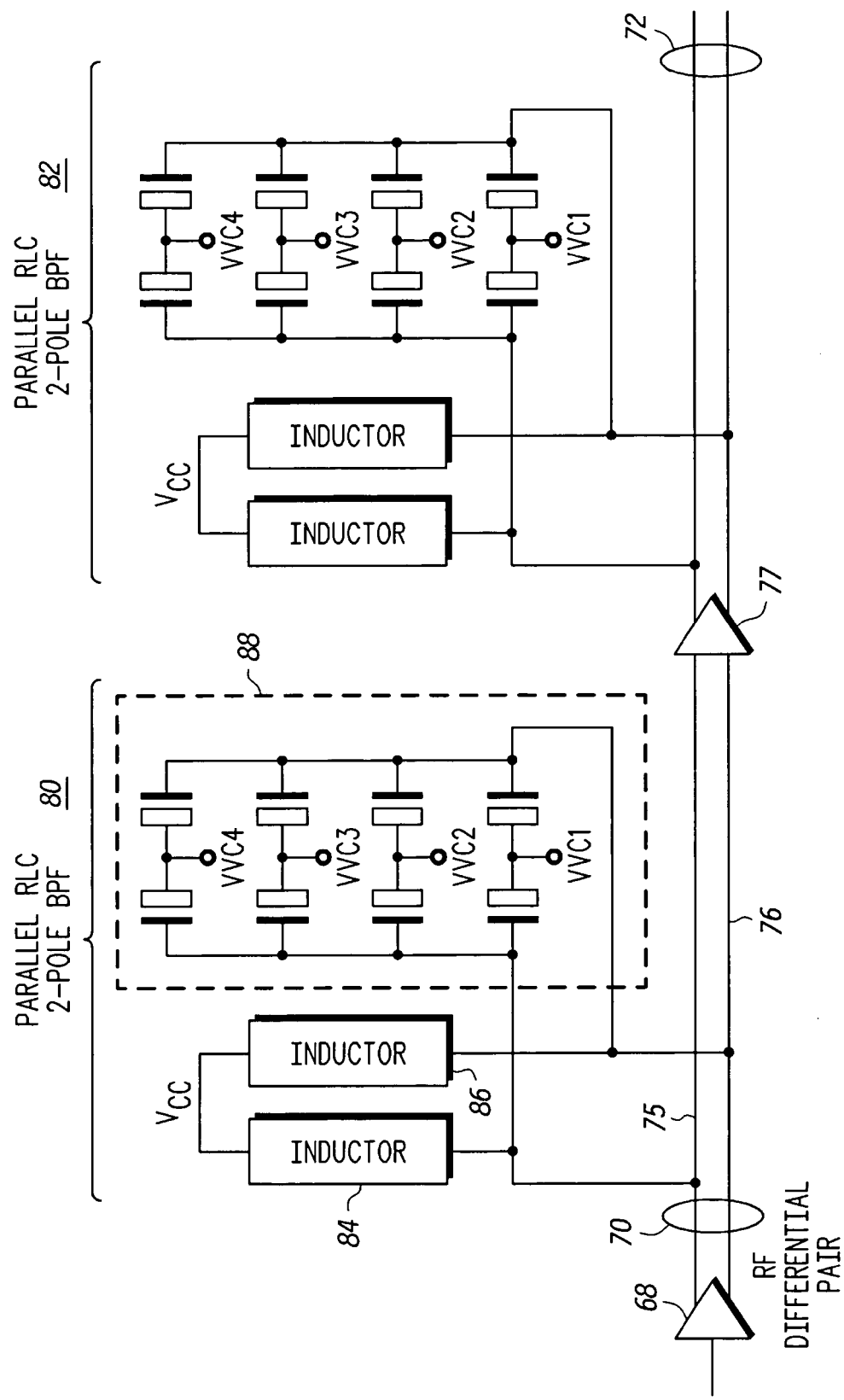
FIG. 3 shows a more detailed block diagram of selected components of the phase rotator for a Cartesian feedback transmitter, in accordance with a preferred embodiment of the present invention.

With reference now to FIG. 3, there is shown a more detailed block diagram of BPFs 80, 82 and buffers 68 and 77, in accordance with a preferred embodiment of the present invention. Buffer 68 amplifies the input from quadrature generator 50 on a RF differential pair 75, 76 over connection 70. The amplified signal is filtered by parallel connected BPF 80 and received by buffer 77, which in turn further amplifies the quadrature signals on differential outputs over connection 72. The quadrature signals are further filtered by parallel connected BPF 82 on the output of phase rotator 42. Band-pass filters 80 and 82 are identically designed, so only band-pass filter 80 will now be described in detail.

Within band-pass filter 80 are inductors 84, 86 coupled to the supply voltage (Vcc) at first ends thereof. Inductor 84 is also coupled at its second end to a first differential output 75 of connection 70, and inductor 86 is coupled at its second end to a second differential output 76 of connection 70. A resonant tank circuit 88 is coupled between connections 75 and 76, and employs a variable reactive stage, such as voltage-variable capacitors (VVC), a varactor, or any other variable reactive device. Resonant tank circuit 88 is capable of receiving the binary-weighted Coarse Trim Bits at control input 78, which is comprised of four input bits specified as VVC bits (VVC 1, VVC 2, VVC 3, VVC 4) in a preferred embodiment. The VVC bits are inputs to separate capacitor pairs within resonant tank circuit 88. A corresponding VVC bit enables or disables a corresponding capacitor pair within resonant tank circuit 88. The combined settings of VVC1-4 defines the reactance of the BPF 82 by enabling or disabling the capacitor pairs, and thereby establishes a response for the resonant tank circuit 88.

Resonant tank circuit 88 is designed consistent with the format of the Coarse Trim Bits such that a selected transmitter frequency on VVC1-VVC4 will set the resonant tank circuit 88 to a corresponding capacitance that in turn will tune the BPF 80 to a center frequency at the desired transmitter frequency. While four capacitive elements are shown in resonant tank circuit 88, fewer or more capacitive elements controlled by fewer or more VVC bits may be utilized to accomplish the desired band-pass filtering function.

It should be noted that, while a VVC is utilized in a preferred embodiment, the variable reactive stage in BPF 80 can be tuned by varying either or both of the capacitors and the inductive coils. However, it is preferable to use a variable voltage capacitor structure due to advantages of integration. Also, the VVC is more easily tuned by simply applying the appropriate voltage signals that are already present for course tuning the VCO. Further, while the preferred embodiment has been described as embodied within a Cartesian feedback power amplifier, it will be appreciated that the present invention applies to other transmitter architectures where it is desirable to control the phase rotation of a feedback signal from a linear power amplifiers, for example in polar modulation.

While the invention has been particularly shown and described with reference to preferred embodiments, it will be understood by those skilled in the art that various changes in form and detail may be made therein without departing from the spirit and scope of the invention. Any variations, modifications, additions, and improvements to the embodiments described are possible and may fall within the scope of the invention as detailed within the following claims.

What is claimed is:

1. A phase rotator comprising:
   a modulator receiving a local oscillator signal and outputting modulated signals on an output coupled to a RF downconverter, wherein a selected frequency of the local oscillator signal is set by a control signal; and
   a band-pass filter coupled to the modulator output, wherein the band-pass filter includes a variable reactive circuit tunable to the selected frequency set by the control signal.

2. The phase rotator of claim 1, wherein the variable reactive circuit further comprises:
   a resonant element; and
   a voltage-variable capacitor (VVC) having a plurality of fixed capacitors, each fixed capacitor having a corresponding capacitance value and being configurable for capacitive-coupling to resonate with said resonant element, wherein said VVC is controlled by a plurality of voltage signals comprising the control signal; and
   wherein a selection of one or more of the plurality of voltage signals configures capacitive coupling of one or more of the fixed capacitors to the modulator output, and thereby tunes the variable reactive circuit to resonate at the selected frequency.

3. The phase rotator of claim 1, wherein the band-pass filter further comprises another variable reactive circuit tunable to the selected frequency specified by the control signal, and being connected in parallel to the output of the modulator.

4. The phase rotator of claim 1, wherein the variable reactive circuit is coupled in parallel to a differential output of the modulator.

5. The phase rotator of claim 1, wherein the control signal is a binary number setting a coarse trim of a frequency of the local oscillator signal.

6. The phase rotator of claim 1, further comprising a gain stage coupled to the output of the modulator and generating radio frequency differential signals coupled to the variable reactive circuit.

7. The phase rotator of claim 1, wherein the RF downconverter is in the feedback path of a Cartesian feedback power amplifier.

8. The phase rotator of claim 1, wherein the variable reactive circuit is a two-pole band-pass filter.

9. The phase rotator of claim 1, wherein the modulator is a quadrature modulator receiving the local oscillator signal and outputting in-phase and quadrature signals.

10. A negative feedback amplifier comprising:
    a first information signal path, including a first amplifier and filter, and a first up-conversion mixer receiving a local oscillator signal;
    a second information signal path, including a second amplifier and filter, and a second up-conversion mixer;
    a combined information signal path coupled to the first and second information signal paths, and including an exciter, amplifier, and output;
    a first feedback signal path coupled between the output and the first information signal path, and including a first RF downconverter;
    a second feedback signal path coupled between the output and the second information signal path, and including a second RF downconverter;
    a local oscillator generating the local oscillator signal as a function of a received control signal, wherein the control signal identifies a selected output frequency for the local oscillator signal;
    a phase rotator coupled to at least the first RF downconverter, wherein the phase rotator receives a phase rotation signal and generates a phase rotated output; and
    a band-pass filter coupled to the phase rotator output and receiving the control signal, wherein the band-pass filter includes a variable reactive circuit tunable to the selected frequency specified by the control signal.

11. The amplifier of claim 10, wherein the variable reactive circuit further comprises:
    a resonant element; and
    a voltage-variable capacitor (VVC) having a plurality of fixed capacitors, each fixed capacitor having a corresponding capacitance value and being configurable for capacitive-coupling to resonate with said resonant element, wherein said VVC is controlled by a plurality of voltage signals; and
    wherein a selection of one or more of the plurality of voltage signals configures capacitive coupling of one or more of the fixed capacitors to the phase rotator output, and thereby tunes the variable reactive circuit to resonate at the selected frequency.

12. The amplifier of claim 10, wherein the band-pass filter further comprises another variable reactive circuit tunable to the selected frequency specified by the control signal, and being connected in parallel to the output of the phase rotator.

13. The amplifier of claim 10, wherein the variable reactive circuit is connected in parallel to a differential output coupled with the phase rotator output.

14. The amplifier of claim 10, wherein the control signal is a binary number setting a coarse trim for the output frequency of the local oscillator.

15. The amplifier of claim 10, further comprising a quadrature modulator coupled to the band-pass filter, wherein the quadrature modulator outputs in-phase and quadrature signals that are band-pass filtered by the band-pass filter.

16. The amplifier of claim 10, wherein the phase rotator further comprises a gain stage that amplifies the phase rotator output and outputs radio frequency differential signals coupled to the variable reactive circuit.

17. The amplifier of claim 10, wherein the negative feedback amplifier is a Cartesian feedback power amplifier.

18. The amplifier of claim 10, wherein the variable reactive circuit is a two-pole band-pass filter.

19. A method of controlling the center frequency of a band-pass filter, the method comprising the steps of:
   receiving a control signal at a first input;
   receiving a modulated signal at a second input;
   tuning a variable reactive circuit to a selected frequency as a function of the control signal, wherein the control signal specifies a selected frequency of a local oscillator signal used to generate the modulated signal;
   coupling the tuned variable reactive circuit to the second input; and
   filtering the modulated signal using the tuned variable reactive circuit;
   wherein the step of tuning further comprises:
   configuring a voltage-variable capacitor (VVC) to resonate at the selected frequency, wherein the VVC having a plurality of fixed capacitors, each fixed capacitor having a corresponding capacitance value and being configurable for capacitive-coupling to resonate with a resonant element, wherein the VVC is configured by receiving a plurality of voltage signals comprising the control signal such that a selection of one or more of the plurality of voltage signals configures capacitive coupling of one or more of the fixed capacitors to the second input.

20. A method of controlling the center frequency of a band-pass filter, the method comprising the steps of:
   receiving a control signal at a first input;
   receiving a modulated signal at a second input;
   tuning a variable reactive circuit to a selected frequency as a function of the control signal, wherein the control signal specifies a selected frequency of a local oscillator signal used to generate the modulated signal;
   coupling the tuned variable reactive circuit to the second input;
   filtering the modulated signal using the tuned variable reactive circuit; and
   tuning another variable reactive circuit to the selected frequency specified by the control signal, and coupling said circuit in parallel to the second input.

21. A method of controlling the center frequency of a band-pass filter, the method comprising the steps of:
   receiving a control signal at a first input;
   receiving a modulated signal at a second input;
   tuning a variable reactive circuit to a selected frequency as a function of the control signal, wherein the control signal specifies a selected frequency of a local oscillator signal used to generate the modulated signal;
   coupling the tuned variable reactive circuit to the second input;
   filtering the modulated signal using the tuned variable reactive circuit; and
   amplifying the modulated signal modulator and generating radio frequency differential signals coupled to the variable reactive circuit.

22. A method of controlling the center frequency of a band-pass filter, the method comprising the steps of:
   receiving a control signal at a first input;
   receiving a modulated signal at a second input;
   tuning a variable reactive circuit to a selected frequency as a function of the control signal, wherein the control signal specifies a selected frequency of a local oscillator signal used to generate the modulated signal;
   coupling the tuned variable reactive circuit to the second input;
   filtering the modulated signal using the tuned variable reactive circuit; and
   performing quadrature modulation to derive the modulated signal.

23. A method of controlling the center frequency of a band-pass filter, the method comprising the steps of:
   receiving a control signal at a first input;
   receiving a modulated signal at a second input;
   tuning a variable reactive circuit to a selected frequency as a function of the control signal, wherein the control signal specifies a selected frequency of a local oscillator signal used to generate the modulated signal;
   coupling the tuned variable reactive circuit to the second input;
   filtering the modulated signal using the tuned variable reactive circuit; and
   performing Cartesian feedback power amplification using the filtered modulated signal.

24. The method of claim 23, wherein the step of filtering comprises performing four-pole band-pass filtering.

* * * * *